United States Patent
JangJian et al.

(10) Patent No.: US 8,772,899 B2
(45) Date of Patent: Jul. 8, 2014

(54) METHOD AND APPARATUS FOR BACKSIDE ILLUMINATION SENSOR

(75) Inventors: Shiu-Ko JangJian, Tainan (TW); Min Hao Hong, Kaohsiung (TW); Kei-Wei Chen, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/409,924

(22) Filed: Mar. 1, 2012

(65) Prior Publication Data

US 2013/0228886 A1 Sep. 5, 2013

(51) Int. Cl.
H01L 31/00 (2006.01)
H01L 31/02 (2006.01)

(52) U.S. Cl.
USPC .................. 257/460; 257/447; 257/458

(58) Field of Classification Search
CPC ............ H01L 27/14601; H01L 27/1464; H01L 27/14643
USPC ......... 257/431, 432, 439, 443, 435, 447, 458, 257/460, 461
See application file for complete search history.

(56) References Cited

U.S. PATENT DOCUMENTS

| | | | |
|---|---|---|---|
| 7,420,207 B2 * | 9/2008 | Kim et al. | 257/55 |
| 7,855,149 B2 * | 12/2010 | Kim et al. | 438/700 |
| 7,952,096 B2 * | 5/2011 | Rhodes | 257/59 |
| 8,017,427 B2 * | 9/2011 | Manabe | 438/72 |
| 8,124,440 B2 | 2/2012 | Ikuta et al. | |
| 8,293,563 B2 | 10/2012 | Hiyama | |
| 8,338,856 B2 * | 12/2012 | Tai et al. | 257/184 |
| 2009/0090937 A1 * | 4/2009 | Park | 257/252 |
| 2010/0006969 A1 | 1/2010 | Park et al. | |
| 2010/0164042 A1 * | 7/2010 | Manabe | 257/437 |
| 2011/0128429 A1 | 6/2011 | Endo et al. | |
| 2011/0204467 A1 * | 8/2011 | Ohchi et al. | 257/443 |
| 2011/0207258 A1 | 8/2011 | Ahn et al. | |
| 2011/0260221 A1 * | 10/2011 | Mao et al. | 257/291 |
| 2013/0299675 A1 | 11/2013 | Yamaguchi et al. | |

FOREIGN PATENT DOCUMENTS

| | | |
|---|---|---|
| JP | 2010016382 | 1/2010 |
| JP | 2010093229 | 4/2010 |
| JP | 2010239154 | 10/2010 |
| JP | 2010278175 | 12/2010 |
| JP | 2011114292 | 6/2011 |
| KR | 1020090035276 | 4/2009 |
| KR | 1020110096275 | 8/2011 |

* cited by examiner

Primary Examiner — Fernando L Toledo
Assistant Examiner — Christine C Lau
(74) Attorney, Agent, or Firm — Slater and Matsil, L.L.P.

(57) ABSTRACT

Methods and apparatus for a backside illuminated (BSI) image sensor device are disclosed. A BSI sensor device is formed on a substrate comprising a photosensitive diode. The substrate may be thinned at the backside, then a B doped Epi-Si(Ge) layer may be formed on the backside surface of the substrate. Additional layers may be formed on the B doped Epi-Si(Ge) layer, such as a metal shield layer, a dielectric layer, a micro-lens, and a color filter.

20 Claims, 6 Drawing Sheets

METHOD AND APPARATUS FOR BACKSIDE ILLUMINATION SENSOR

BACKGROUND

Complementary metal-oxide semiconductor (CMOS) image sensors are gaining in popularity over traditional charged-coupled devices (CCDs). A CMOS image sensor typically comprises an array of picture elements (pixels), which utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. The electrons are converted into a voltage signal in the pixel and further transformed into a digital signal.

A CMOS image sensor, which may be referred as a CMOS sensor, may comprise a plurality of dielectric layers and interconnect layers formed on the substrate, connecting the photo diode in the substrate to peripheral circuitry. The side having the dielectric layers and interconnect layers is commonly referred to as a front side, while the side having the substrate is referred to as a backside. Depending on the light path difference, CMOS image sensors can be classified as frontside illuminated (FSI) image sensors and back-side illuminated (BSI) sensors.

In an FSI image sensor, light from the subject scene is incident on the front side of the CMOS image sensor, passes through dielectric layers and interconnect layers, and falls on the photo diode. In contrast, in a BSI image sensor, light is incident on the backside of the CMOS image sensor without the obstructions from the dielectric layers and interconnect layers. As a result, light can hit the photo diode through a direct path. Such a direct path helps to increase the number of photons converted into electrons, which makes the CMOS sensor more sensitive to the light source.

In order to improve quantum efficiency of BSI image sensors, the substrate of BSI image sensors may be thinned. In addition, through an ion implantation process, a thin P+ layer may be formed on the thinned substrate to further improve quantum efficiency. Subsequently, a laser annealing process may be performed to activate the implanted P+ ions as well as repair crystal defects caused by the ion implantation process. Such a laser annealing process may cause dark mode image stripe patterns due to laser scanning boundary effects on the image sensor. To avoid such dark mode image stripe patterns, a thin oxide layer may grow to protect the silicon surface. Such a sequence of process on the backside of the substrate is long and costly. Methods for reducing the processing sequence for the BSI sensors while improving quantum efficiency are of interest.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure discloses methods and apparatus for a backside illuminated (BSI) image sensor or a BSI sensor device. According to the embodiments, the substrate of a BSI sensor device may be thinned at the backside, then a B doped Epi-Si(Ge) layer may be formed on the backside surface of the substrate, wherein the B doped Epi-Si(Ge) layer includes silcon and germanium. The Epi-Si(Ge) seed layer could repair Si surface damage caused during the BSI thin down process, while Ge, whose atom is 4% larger than Si, may improve quantum efficiency. In-situ B doped Epi-Si(Ge) layer may generate controllable P-type layer as being p-n junction at BSI Si surface, which may improve electron leakage and white pixel performance. The embodiments of the disclosure may be applied to a variety of complementary metal-oxide semiconductor (CMOS) sensors. The embodiments are illustrated using one pixel region of the sensor device as an example.

Figures 1A, 1B:
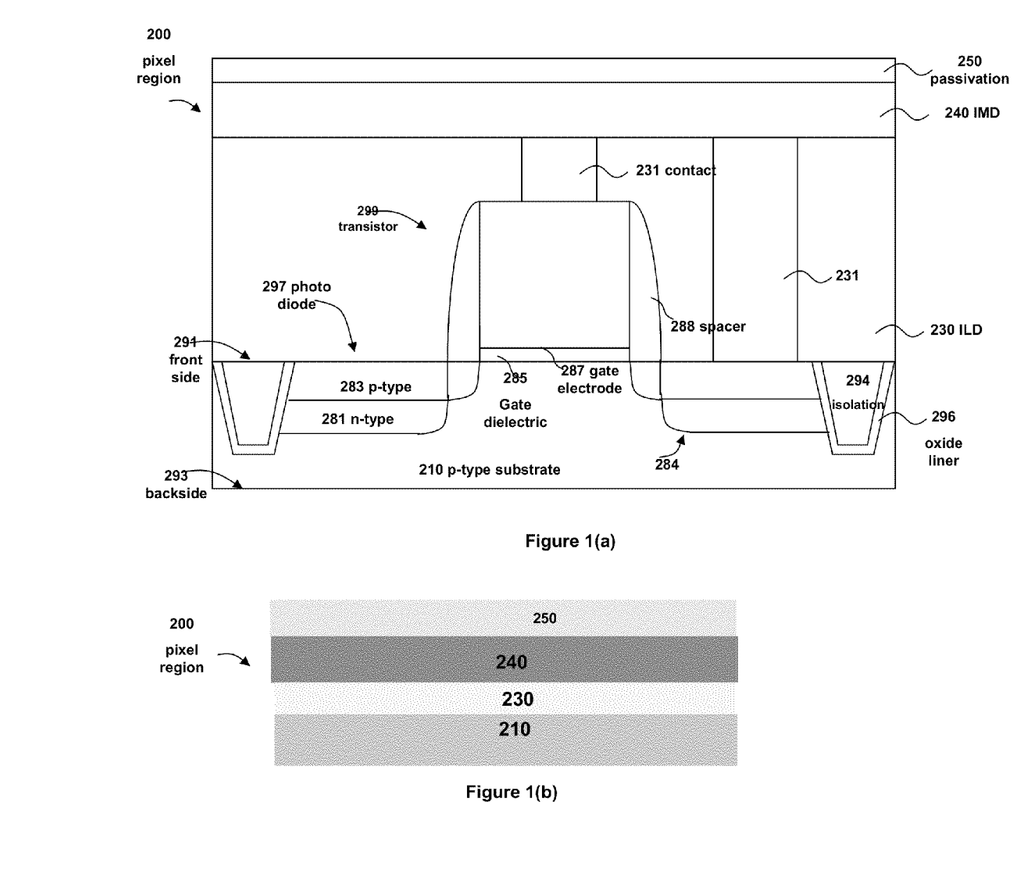
FIGS. 1(a) and 1(b) illustrate a front side formation of a backside illuminated (BSI) sensor device.

FIG. 1(a) illustrates a simplified cross-sectional view of an individual pixel region 200. The pixel region 200 may also be referred as a BSI sensor device in this disclosure since a BSI sensor element may be formed within the pixel region. An image sensor may comprise a grid or array of such pixel regions or sensor elements formed on the pixel regions. The pixel region 200 may be formed on a substrate 210 with a front side 291 and a back side 293. The substrate 210 may be a semiconductor material such as silicon, germanium, diamond, or the like. The substrate 210 may be doped with a p-type dopant, such as boron, aluminum, gallium, or the like, although the substrate may alternatively be doped with an n-type dopant, as is known in the art.

The substrate 210 may comprise a plurality of isolation areas 294 to separate and isolate various devices formed on the substrate 210, and also to separate the pixel regions 200 from other logic regions of an image sensor. The isolation areas 294 may be shallow trench isolations generally formed by etching the substrate 210 to form a trench and filling the trench with dielectric material as is known in the art. Optionally, an oxide liner 296 may be formed along the sidewalls of the isolation areas 294.

The substrate 210 may comprise a photosensitive diode 297, or simply referred as a photo-diode 297, which may generate a signal related to the intensity or brightness of light that impinges on the photosensitive diode 297. In an embodiment the photosensitive diode 297 may be a pinned layer photodiode. The pinned layer photodiode 297 may comprise an n-type doped region 281 formed in the substrate 210, which in this embodiment may be a p-type substrate. It also may comprise a heavily doped p-type region 283 (referred to as the pinned layer) formed on the surface of the n-type doped region 281 to form a p-n-p junction. As one of ordinary skill in the art will recognize, the pinned layer photodiode described above is merely one type of photosensitive diode 297 that may be used in the embodiments. For example, a non-pinned layer photodiode may alternatively be used. Any suitable photodiode may be utilized with the embodiments, and all of these photodiodes are intended to be included within the scope of the embodiments.

The pixel region 200 may comprise a transistor 299, which may be a transfer transistor, a reset transistor, a source follower transistor, or a select transistor. The transistor 299 may comprise a gate dielectric 285 adjacent the substrate 210, a gate electrode 287 over the gate dielectric, and spacers 288 along the sidewalls of the gate dielectric 285 and gate electrode 287. Gate dielectric 285 and gate electrode 287 may be formed and patterned on the substrate 210 by any suitable process known in the art.

A source/drain region 284 of the transistor may be formed in the substrate 210 on an opposing side of the gate dielectric 285 from the photosensitive diode 297. In an embodiment in which the substrate 210 is a p-type substrate, the source/drain region 284 may be formed by implanting appropriate n-type dopants such as phosphorous, arsenic, antimony, or the like. It should be noted that one of ordinary skill in the art will realize that many other processes, steps, or the like may be used to form the source/drain region 284 and the photosensitive diode 297.

An inter-layer dielectric (ILD) layer 230 may be formed over the pixel region 200. The ILD layer 230 may comprise a material such as boron phosphorous silicate glass (BPSG), although any suitable dielectrics may be used for either layer. Contacts 231 may be formed through the ILD layer 230 with suitable photolithography and etching techniques. The contacts 231 may comprise a barrier/adhesion layer, not shown, to prevent diffusion and provide better adhesion for the contacts 231.

Various conductive and dielectric layers may be formed on the ILD layer 230, which are collectively referred to in FIG. 1(a) as the inter-metal dielectric (IMD) layer 240, to connect various devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the ILD layer 230 and IMD layer 240, a passivation layer 250 may be formed in order to protect the underlying layers from physical and chemical damage. The passivation layer 250 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 250 may be formed through a process such as chemical vapor deposition (CVD), although any suitable process may be utilized.

The detailed view illustrated in FIG. 1(a) may be shown in a more abstract way in FIG. 1(b). The pixel region 200 at this stage comprises a silicon substrate 210, an IDL layer 230, an IMD layer 240 that separates multiple levels of metallization, and a passivation layer 250. Exemplary details of the layers 210, 230 and 240 are illustrated in FIG. 1(a). The ILD and IMD layers may alternatively be viewed as collectively forming a single dielectric layer. Various image sensor features such as interconnects, gates or other circuitry elements may be formed within a given dielectric layer using conventional techniques. The pixel region 200 may also be referred as a BSI sensor device 200 or a BSI sensor element in this disclosure since a BSI sensor element may be formed at the pixel region, and a BSI sensor or a BSI sensor device comprises a plurality of BSI sensor elements.

Figure 2A:
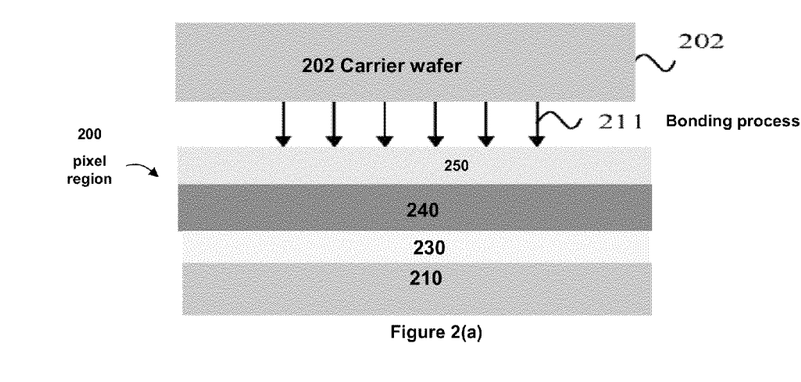
FIGS. 2(a)-2(g) illustrate methods and apparatus for backside processing for forming a BSI sensor device in accordance with the embodiments.

As illustrated in FIG. 2(a) in a cross-sectional view, a carrier wafer 202 may be bonded by a bonding process 211 to the BSI sensor device 200, which includes a silicon substrate 210, an IDL layer 230, an IMD layer 240 that separates multiple levels of metallization, and a passivation layer 250 as illustrated in FIG. 1(b). The bonding process 211 may include typical bonding processes for coupling the carrier wafer 202 to device 200 on the passivation layer 250. The carrier wafer 202 may be bonded directly on the IMD layer 240 instead of the passivation layer 250 in some other embodiments. The carrier wafer 202 may comprise, for example, a type of wafer commonly referred to as a handle wafer.

Figure 2B:
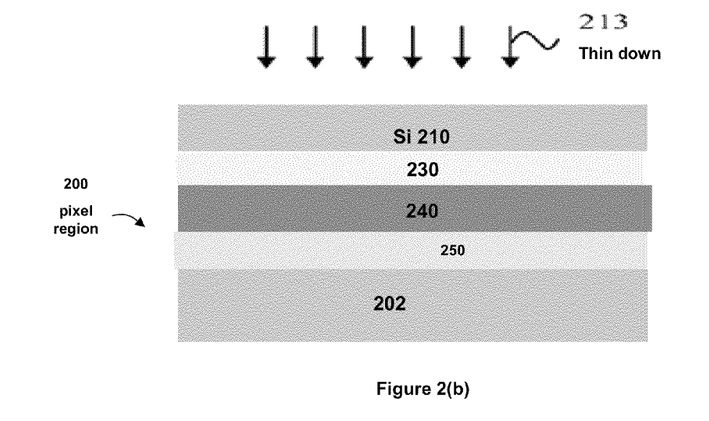

As illustrated in FIG. 2(b) in a cross-sectional view, the carrier wafer 202 together with the device 200 is flipped over so that the carrier wafer 202 is at the bottom providing support for the structure. The structure further undergoes an etch or thin down process 213 to thin the substrate 210 at the backside such that light directed through the back surface thereof may effectively reach sensor elements formed within the substrate.

Figure 2C:
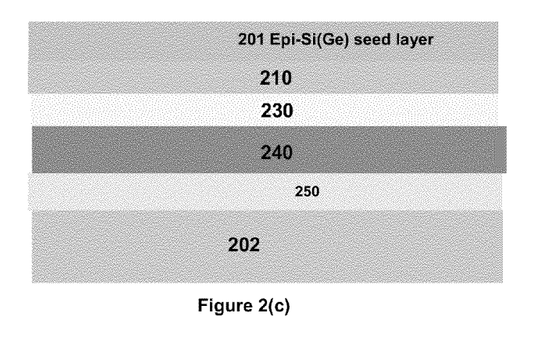

As illustrated in FIG. 2(c) in a cross-sectional view, an Epi-Si(Ge) seed layer 201 may be formed on the thinned substrate 210 at the backside. In some embodiments, the Epi-Si(Ge) seed layer 201 may be formed as follows. A seed layer of Si(Ge) material is formed first, wherein the Si(Ge) layer includes silicon and germanium, with a thickness in a range about 100 to 700 Å and possibly in a range about 200 to 500 Å. The Epi-Si(Ge) layer, an epitaxial layer includes silicon and germanium, may be formed under the following exemplary condition: Si precursor may preferably be $SiH_4$, $SiH_2Cl_2$, $SiHCl_3$ or $SiCl_4$ and more preferably $SiH_4$; Ge precursor may preferably be $GeH_4$ or $GeCl_4$ and more preferably $GeH_4$; temperature may preferably be from about 500 to 750° C. and more preferably from about 600 to 700° C.; pressure may preferably be from about 5 to 100 Torr and more preferably from about 10 to 60 Torr. The Epi-Si(Ge) seed layer could repair Si surface damage caused during the BSI thin down process, while Ge, whose atom is 4% larger than Si, may improve quantum efficiency.

Figure 2D:
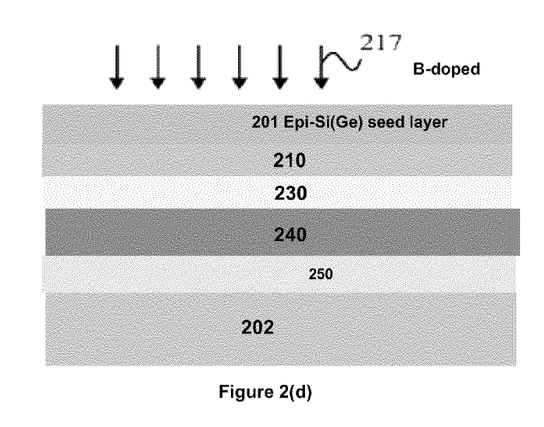

As illustrated in FIG. 2(d) in a cross-sectional view, a B-doped Epi-Si(Ge) layer may be formed, referred as the B-doped Epi-Si(Ge) layer 201. The layer 201 is preferably doped with boron (B) through a doping process 217. When doping with boron, $B_2H_6$ may be introduced at a rate of preferably from about 5 to 100 sccm and more preferably from about 10 to 50 sccm under the following conditions: temperature may preferably be from about 500 to 750° C. and more preferably from about 600 to 700° C.; pressure may preferably be from about 5 to 100 Torr and more preferably from about 10 to 60 Torr; and time may preferably be from about 10 to 120 seconds and more preferably from about 10 to 60 seconds. The dopant may preferably have a concentration of from about 1E18 to 1E22 atoms/square cm and more preferably about 1E19/square cm. In-situ B doped Epi-Si(Ge) layer may generate controllable P-type layer as being p-n junction at BSI Si surface, which may improve electron leakage and white pixel performance.

Figure 2E:
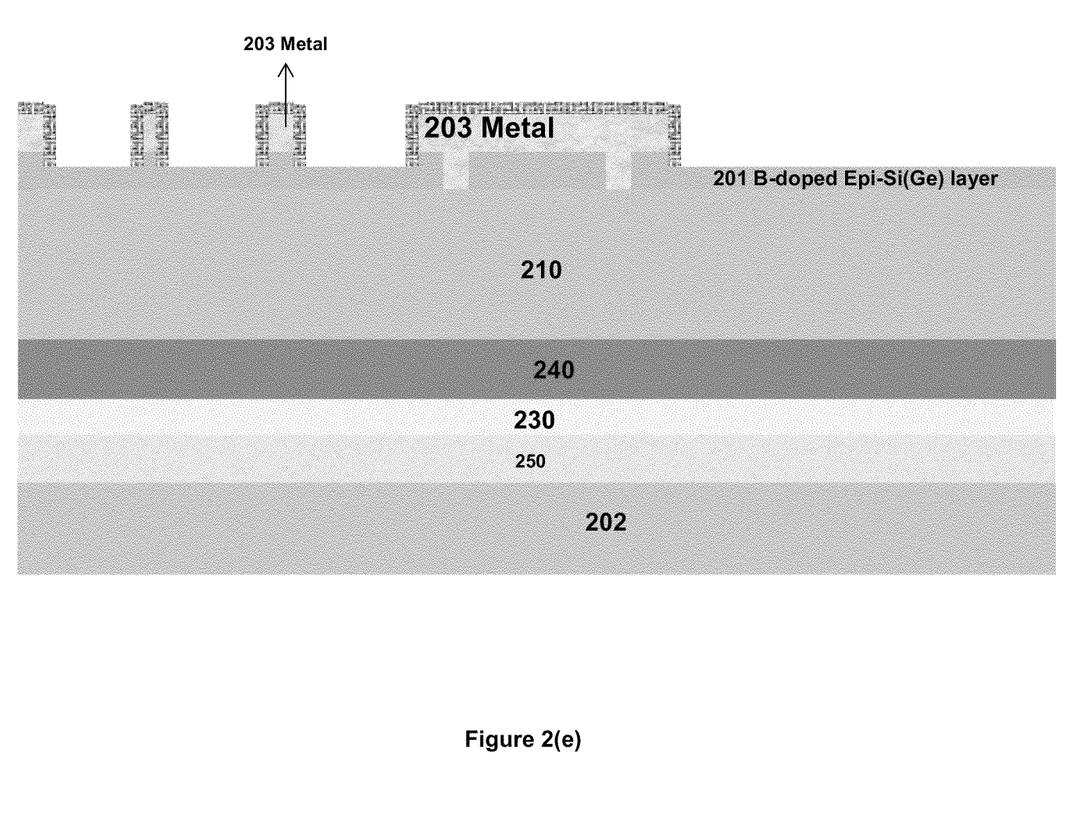

As illustrated in FIG. 2(e) in a cross-sectional view, a metal contact 203 may be formed on the B-doped Epi-Si(Ge) layer 201. A metal contact 203 or a plurality of such contacts 203 may form a metal contact layer. Metal contacts 203 may be made through any suitable formation process (e.g., lithography with etching, damascene, dual damascene, or the like) and may be formed using suitable conductive materials such as aluminum alloys, copper alloys, or the like. The metal contacts 203 may act as a metal shield to provide black level correction (BLC) for the sensor element.

Figure 2F:
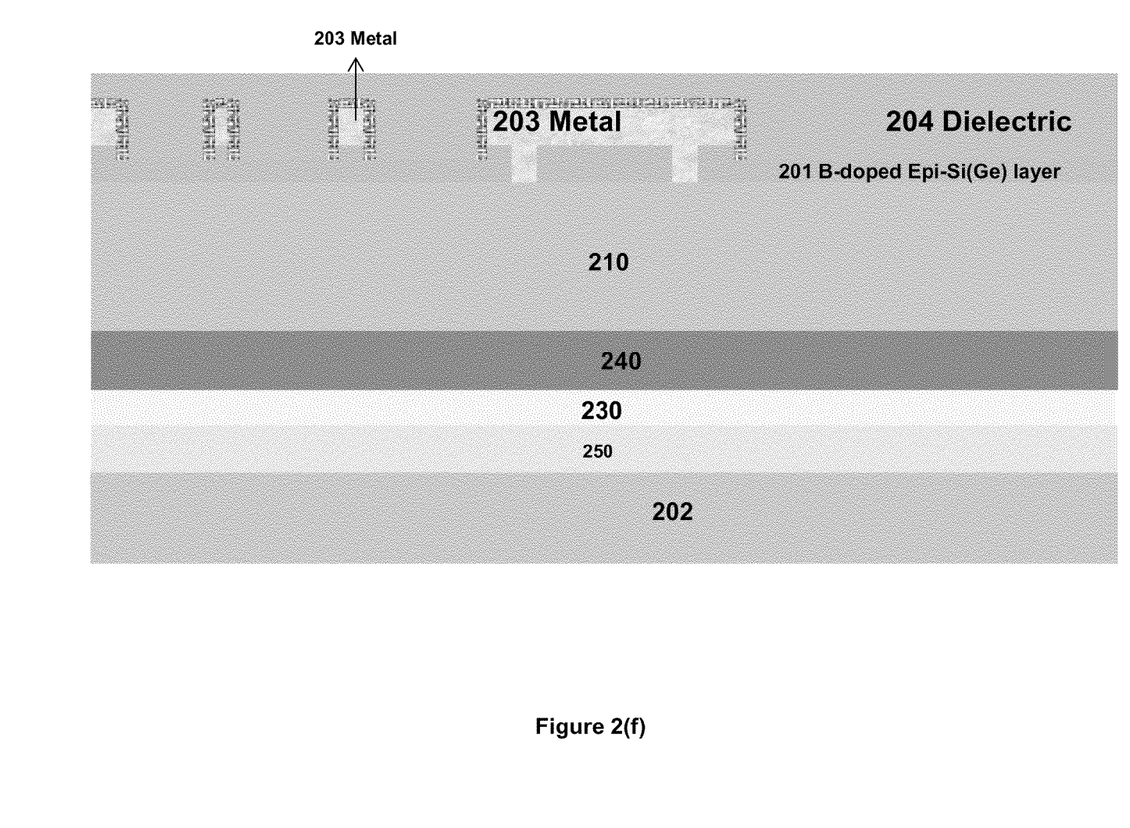

As illustrated in FIG. 2(f) in a cross-sectional view, a dielectric layer 204 may be formed on the backside surface of the substrate 210 on the metal shield layer. The dielectric layer 204 may comprise SiN, SiON, SiC, $Ta_2O_5$, $Al_2O_3$, $HfO_2$, $ZrO_2$, $TiO_2$, or alloys thereof. The dielectric layer 204 may be deposited to a thickness between about 200 angstroms and about 2,000 angstroms. Advantageously, the dielectric layer 204 may also be formed to function as a backside passivation layer for mechanical support and/or protection against moisture, as an etch stop layer for subsequent processing, and/or as an antireflective coating (ARC) to maximize quantum efficiency. In one embodiment, the dielectric layer 204 may be formed for protection and for reducing stress on the internal structure of the devices within the substrate. The dielectric layer 204 may be formed directly on the layer 201. The dielectric layer 204 may not be formed at all for some other embodiments.

Figure 2G:
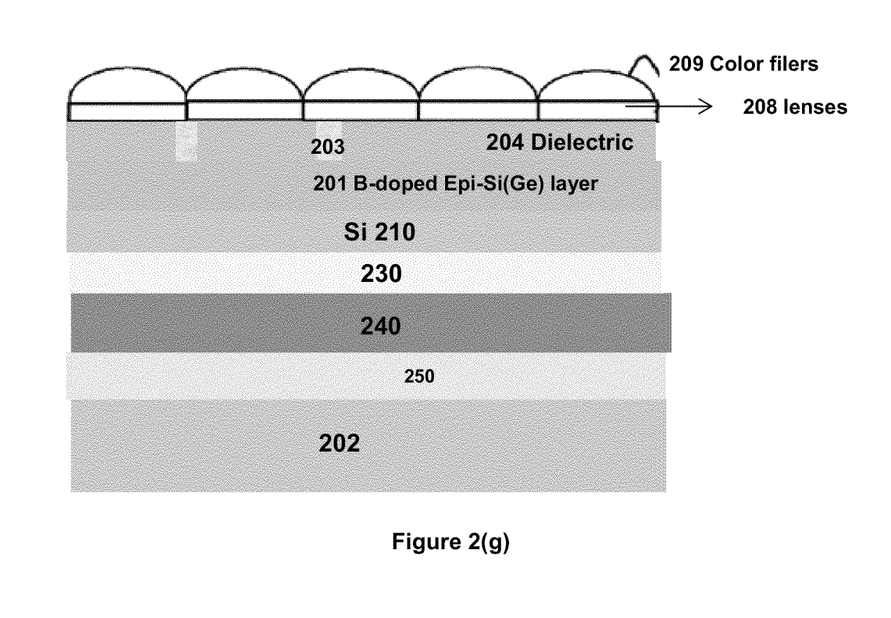

As illustrated in FIG. 2(g) in a cross-sectional view, a micro-lens 208 and a color filter element 209 may be formed on dielectric layer 204 for color imaging applications. The micro-lens lenses 208 may be located between the color filter 209 and the backside of the substrate 210, such that the backside-illuminated light can be focused on the light-sensing regions. The micro-lens 208 converges light illuminated from the backside of the substrate 210 to the photodiode. Associated with each of the color filter elements 209 is a corresponding micro-lens 208. The color filter elements and associated micro-lenses may be aligned with the photosensitive elements of the sensor layer using alignment marks, although such marks are not shown.

In the disclosed structure and the method to make the same, the illuminated light during applications may not be limited to a visual light beam, but can be extended to other optical light such as infrared (IR) and ultraviolet (UV), and other proper radiation beams.

It is understood that additional processes may be performed to complete the fabrication of the semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). A plurality of integrated circuit devices may also be formed on the front side surface of substrate 210. For the sake of simplicity, these additional processes are not described herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A backside illuminated (BSI) sensor device, comprising:
a substrate with a front side and a backside;
a photosensitive diode within the substrate, the photosensitive diode being positioned along the front side of the substrate; and
a B doped Epi-Si(Ge) layer on a surface of the backside of the substrate, wherein the B doped Epi-Si(Ge) layer comprises silicon and germanium.

2. The BSI sensor device of claim 1, wherein the B doped Epi-Si(Ge) layer is of thickness in a range about 100 to 700 Å.

3. The BSI sensor device of claim 1, further comprising an isolation area within the substrate.

4. The BSI sensor device of claim 1, wherein the photosensitive diode is a pinned layer photodiode comprising a p-n-p junction.

5. The BSI sensor device of claim 1, further comprising a metal shield layer on the B doped Epi-Si(Ge) layer.

6. The BSI sensor device of claim 1, further comprising a dielectric layer on the B doped Epi-Si(Ge) layer.

7. The BSI sensor device of claim 1, further comprising a micro-lens on the B doped Epi-Si(Ge) layer.

8. The BSI sensor device of claim 1, further comprising a color filter on the B doped Epi-Si(Ge) layer.

9. The BSI sensor device of claim 1, further comprising a transistor on a surface of the front side of the substrate.

10. The BSI sensor device of claim 1, further comprising a passivation layer on a surface of the front side of the substrate.

11. The BSI sensor device of claim 1, further comprising an inter-layer dielectric (ILD) layer on a surface of the front side of the substrate.

12. A backside illuminated (BSI) sensor device, comprising:
a pixel array in a substrate, wherein the substrate has a front side and a backside, and wherein the substrate comprises a plurality of photosensitive diodes of the pixel array, the photosensitive diodes being positioned in the front side of the substrate;
a B doped Epi-Si(Ge) layer on a surface of the backside of the substrate, wherein the B doped Epi-Si(Ge) layer comprises silicon and germanium;
a metal shield layer on the B doped Epi-Si(Ge) layer;
a dielectric layer on the metal shield layer;
a micro-lens layer on the B doped Epi-Si(Ge) layer; and
a color filter on the micro-lens layer.

13. The BSI sensor device of claim 12, further comprising an isolation area within the substrate.

14. The BSI sensor device of claim 12, wherein a photosensitive diode of the plurality of photosensitive diodes of the pixel array is a pinned layer photodiode comprising a p-n-p junction.

15. The BSI sensor device of claim 12, wherein the B doped Epi-Si(Ge) layer is of thickness in a range about 100 to 700 Å.

16. The BSI sensor device of claim 12, further comprising a transistor on a surface of the front side of the substrate.

17. The BSI sensor device of claim 16, further comprising a passivation layer on the front side of the substrate.

18. A backside illuminated (BSI) sensor device, comprising:
a pixel array in a front side of a substrate, wherein the substrate comprises a plurality of photosensitive diodes of the pixel array, a photosensitive diode of the plurality of photosensitive diodes of the pixel array is a pinned layer photodiode comprising a p-n-p junction;
a B doped Epi-Si(Ge) layer on a surface of a backside of the substrate, wherein the B doped Epi-Si(Ge) layer is an epitaxial layer comprising silicon and germanium;

a metal shield layer on the B doped Epi-Si(Ge) layer;
a dielectric layer on the metal shield layer;
a micro-lens layer on the B doped Epi-Si(Ge) layer; and
a color filter on the micro-lens layer.

19. The BSI sensor device of claim 18, further comprising an isolation area within the substrate.

20. The BSI sensor device of claim 18, wherein the B doped Epi-Si(Ge) layer is of thickness in a range about 100 to 700 Å.

* * * * *